United States Patent [19]

Kondo et al.

[11] Patent Number: 5,635,301

[45] Date of Patent: Jun. 3, 1997

[54] MULTILAYERED GLASS SUBSTRATE

[75] Inventors: Kazuo Kondo; Asao Morikawa, both of Aichi, Japan

[73] Assignee: NGK Spark Plug Co., Ltd., Aichi, Japan

[21] Appl. No.: 252,541

[22] Filed: Jun. 1, 1994

Related U.S. Application Data

[60] Continuation of Ser. No. 942,390, Sep. 9, 1992, abandoned, which is a division of Ser. No. 303,374, Jan. 30, 1989, Pat. No. 5,175,130.

[30] Foreign Application Priority Data

Feb. 10, 1988 [JP] Japan .................. 63-27624

[51] Int. Cl.⁶ ........................... B32B 17/06
[52] U.S. Cl. ................... 428/426; 428/209; 428/210; 428/212; 428/215; 428/216; 428/307.3; 428/316.6; 428/318.6; 428/319.1; 428/428; 428/432; 428/450; 428/697; 428/699; 428/701
[58] Field of Search ................ 428/209, 210, 428/212, 218, 450, 901, 697, 699, 701, 426, 432, 428, 215, 216, 306.6, 307.3, 316.6, 318.6, 319.1; 501/4, 7, 8, 9, 22, 135

[56] References Cited

U.S. PATENT DOCUMENTS

| | | | |
|---|---|---|---|
| 3,081,944 | 3/1963 | Beall et al. | 501/39 |
| 3,867,156 | 2/1975 | Fukumoto et al. | 501/154 |
| 3,950,174 | 4/1976 | Suzuki et al. | 501/9 |
| 4,465,727 | 8/1984 | Fujita | 428/697 |
| 4,504,339 | 3/1985 | Kamehara et al. | 264/66 |
| 4,536,435 | 8/1985 | Utsumi et al. | 428/432 |
| 4,540,671 | 9/1985 | Kondo | 428/901 |
| 4,609,582 | 9/1986 | Joormann | 428/210 |
| 4,649,070 | 3/1987 | Kondo | 428/901 |
| 4,666,867 | 5/1987 | Beall et al. | 501/8 |
| 4,679,320 | 7/1987 | Imanaka et al. | 29/840 |
| 4,748,085 | 5/1988 | Fukuda | 428/428 |
| 4,791,077 | 12/1988 | Kim et al. | 501/103 |
| 4,897,509 | 1/1990 | Holleran | 428/210 |
| 4,931,354 | 6/1990 | Wakino | 428/210 |
| 4,997,795 | 3/1991 | Hang | 428/210 |
| 5,021,287 | 6/1991 | Otagiri | 428/212 |

FOREIGN PATENT DOCUMENTS

| | | |
|---|---|---|
| 59-64545 | 4/1984 | Japan . |
| 59-83957 | 5/1984 | Japan . |
| 59-92943 | 5/1984 | Japan . |
| 61-137341 | 8/1984 | Japan . |
| 61-134081 | 8/1986 | Japan . |
| 61-278194 | 12/1986 | Japan . |

*Primary Examiner*—Ellis Robinson
*Assistant Examiner*—Timothy M. Speer
*Attorney, Agent, or Firm*—Finnegan, Henderson, Farabow, Garrett & Dunner, L.L.P.

[57] ABSTRACT

A multilayered substrate is disclosed comprising a first layer of relatively dense crystalline glass, and a second layer of a porous crystalline glass characterized by a relatively low dielectric constant bonded to the first layer. The crystalline glass in both layers is of substantially the same composition.

5 Claims, 1 Drawing Sheet

MULTILAYERED GLASS SUBSTRATE

This application is a continuation, of application Ser. No. 07/942,390, filed Sep. 9, 1992, now abandoned, which is a division of application Ser. No. 07/303,374, filed Jan. 30, 1989 now U.S. Pat. No. 5,175,130.

BACKGROUND OF THE INVENTION

The present invention relates to a substrate for use with electronic devices and particularly one formed at low temperature having a low dielectric constant.

Conventionally, alumina has been used as the material to form a substrate for electronic apparatus. As semiconductor devices have increased in integration (LSI's, VLSI's) and as the requirements for high response speed and large scale have affected the production of electronic devices, interest has been shown in substrates. The substrates formed at low temperature include glass composite substrates, crystalline glass substrates and non-glass substrates. These materials are more advantageous in that they can be formed together with low resistance conductors having lower or dielectric constants than the prior art alumina substrates.

Recent developments in high speed computer design, however, have made further demands in lowering the dielectric constant necessary for the substrate because the frequency used in the electric elements mounted thereon have become higher and higher, up to the GHz range.

Such applications have created interest in lowering the dielectric constant of the substrate. For example, a substrate has been proposed that is made from a crystalline compound oxide and silicon dioxide as main components, having pores in the substrate not larger than three microns (μm) in size with a porosity in the range of from 10 to 30 volume percent to lower the relative dielectric constant to a value of not higher than 0.5 at 1 megahertz. See Japanese Patent Unexamined Publication No. 61-278194. In such a substrate, however, the practical lower limit of the dielectric constant is 4.0 because of constraints imposed by the needed mechanical strength of such a substrate. There has also been proposed a complex layered substrate having a front and rear surface layer made of a material having a mechanical strength of not less than 15 Kg/mm² An intermediate layer, disposed between the two surface layers, is formed of a material having a dielectric constant of not more than 5 (Japanese Utility Model Unexamined Publication No. 61-134081). In forming this layered substrate, however, the materials in the outer layers are different than the center layer so that the bonding between the different materials is potentially difficult with a risk of deterioration of the bond between the layers.

Therefore, one object of the present invention is to provide a substrate that can be formed at low temperature having sufficiently high mechanical strength with a coefficient of thermal expansion near to that of a silicon chip in which the dielectric constant can be lowered. As a result, signal delay time of electric components associated with the substrate can be shortened to cope with the trend in electronic devices requiring higher and higher response speeds. Another object of tile present invention is to provide a method of manufacturing a substrate than can be formed at low temperature in mass production techniques that are economically feasible.

SUMMARY OF THE INVENTION

To achieve these and other objects of the invention, there is provided a substrate consisting essentially of a porous crystalline glass. The porosity in the glass is present in an amount and distribution such that the substrate has a relatively low dielectric constant. Preferably, the crystalline glass has a particle size less than 0.5 μm with a porosity of about 60 percent by volume. It is further preferred that the pore size of the porosity have a diameter of 10 μm or less.

DESCRIPTION OF THE PREFERRED EMBODIMENTS

Figure 1:
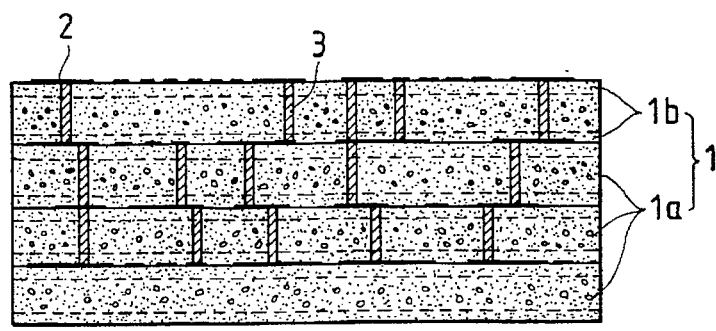
FIG. 1 is a sectional view showing a multi-layer circuit substrate that is one embodiment of the invention.

The present invention will now be disclosed in terms of the preferred embodiments.

The present invention utilizes a material known as a crystalline glass. As that term is used in the present application, it means a polycrystal body of fine crystals of micron order reheated after being formed as glass (the same in meaning as glass ceramics). Such materials are well known in the art. See U.S. Pat. Nos. 4,649,070 and 4,540,671 which are incorporated by reference herein.

The compositions useful in the present invention are materials of a series represented by $RO$—$Al_2O_3$—$SiO_2$ ($RO$ represents at least one kind of metal oxide such as ZnO, MgO, $Li_2O$, $ZrO_2$, $B_2O_3$, $P_2O_5$, $Y_2O_3$, BaO, and the like). Examples of the series represented by $RO$—$Al_2O_3$—$SiO_2$ include, for example, a series of cordierite compositions such as (ZnO—MgO—$Al_2O_3$—$SiO_2$), a series of CaO—$B_2O_3$—MgO—$Al_2O_3$—$SiO_2$, and a series of compositions represented by $Y_2O_3$—MgO—$Al_2O_3$—$SiO_2$, and particularly a series of cordierites where the cordierites ($2MgO$—$5Al_2O_3$—$5SiO_2$) is the main crystal in the material (for example, reference is made to Japanese Patent Unexamined Publication Nos. 59-83957, 59-929433, and 59-137341). The crystalline glass material of the present invention may be a glass composite material in which a filler material such as a ceramic or the like is added to glass, or the composite material may have non-glass materials included therein (for example, reference is made to Japanese Patent Unexamined Publication No. 59-64545).

The average crystal particle size of the powder forming the crystalline glass may be 5 μm or less, preferably 3 μm or less. This is to maintain the mechanical strength of the article even when the porosity is high. The material should have a dielectric constant of 6 or less (at 1 MHz), preferably 5 or less, at full theoretical density.

The porosity should be in the range of from 5 to 95 volume percent. If the porosity is smaller than 5%, the reduction the dielectric constant is not sufficient, while if the exceeds 95%, shortcircuits cannot be prevented, and the reduction in mechanical strength is significant. It is preferred that the porosity be 30% or more, more preferably about 60%, so that the dielectric constant can be reduced to 4.0 or less, and further to 3.0 or less. In the case where the porosity is selected to be 30% or more, it is preferred to make the porous layer one layer of a layered composite article having at least one dense layer on at least one surface thereof. This prevents shortcircuits from occurring in use and improves the surface smoothness. It is preferred to have the average pore size be 10 μm or less. If the average pore size exceeds 10 μm, there is risk of shortcircuits. It is preferred that the average pore diameter is 5 μm or less, more preferably 3 μm or less. It is further preferred that pores having a size of 10 μm or less comprise 50% or more relative to all the pores, preferably 80% or more.

In the case of the layered composite structure described above, it is preferable that the porous layer and the dense layers are made of a material of the same type. This prevents deterioration of the bonding between the layers and the occurrence of shortcircuits to the utmost. The ratio of thickness of one layer to the other, that is, of the dense layer to the porous layer (one side) is preferably in the range of from $1/25$ to $2/15$. Specifically, it is preferred that the thickness of the porous layer be in the range of from 150 to 250 μm after the heat treatment. If the thickness of the porous layer exceeds 250 μm, there is a risk of having poor mechanical strength. On the other hand, the thickness of the dense layer of the layered composite should be 10 to 20 μm. This is because if the thickness of the dense layer is under 10 μm, it is impossible to prevent shortcircuits from occurring, while if it exceeds 20 μm, the dielectric constant exceeds 4.0. It is preferred that pores be evenly distributed throughout the substrate as independent, closed pores. If there is interconnected porosity, there is a risk of shortcircuits, and if the pores are unevenly distributed, there are variations in the degree of reduction of the dielectric constant.

Where pores are formed in a crystalline glass material in such a manner as described above, the dielectric constant is 1 at portions where pores exist and as a result, the dielectric constant in the device may be significantly reduced. The porosity can be maintained very high so that the dielectric constant can be established to be 4.0 or less. In a preferred embodiment, the dielectric constant may be made to be 3.5 or less, or 3 or less. Significantly, these levels of reduction off the dielectric constant can be achieved while maintaining the mechanical strength at a commercially useful level of 10 to 13 kg/mm². Furthermore, the coefficient of thermal expansion may be made to be a value of $\alpha=2$ to $5\times10^{-6}/°C$. which is approximate to that of a silicon chip ($\alpha=3.5\times10^{-6}/°C$.).

In the manufacturing method, crystalline glass powder is used as a main component of a slurry mixture. The crystalling glass powder is mixed with a solvent, a dispersant, a plasticizer, and carbon power by means of a trommel to form a slurry. Carbon black or the like may be used as the carbon powder. It is preferable to select the particle size of the crystalline glass material powder to be 2 μm to 3 μm. It is preferable that the particle size of the carbon powder is selected to be not larger than that of the crystalline glass powder, for example, to be 2 μm or less. The carbon powder is mixed by 30 to 70 wt %, preferably 40 to 60 wt %, relative to the weight of the crystalline glass powder. The slurry is formed into a green sheet having a thickness of 0.5 μm or less, preferably 0.1 to 0.3 μm, using a doctor blade method. Since the carbon powder and the crystalline glass powder have approximately the same specific gravity, the carbon is evenly dispersed while making the sheet.

The sheet is then subjected to heat treatment in an oxidizing atmosphere, for example, at a temperature not higher than 900° C. preferably not higher than 500° C., so that the carbon is oxidized out of the material first. The crystalline glass article is then sintered for a sufficient time to retain porosity and close the interconnected porosity initially formed by the carbon powder. This forms a porous substrate. Alternatively, the heating may be carried out through a multi-stage method in which final sintering is performed after initial heating, or the sintering may be carried out in a reducing atmosphere. It is particularly preferred to conduct the final sintering while conducting a CuO/Cu metallizing printing operation. The temperature of the initial heating can be in the range of from about 500° to 700° C. In the case of manufacturing a substrate having such a layered composite (sandwich) structure as described above, a second slurry is used that contains the same material as that for the initial porous layer. In other words, the second layer is formed from a slurry composed of the same components excluding carbon powder as the porous layer. The initial porous layer is coated at its opposite surfaces with the second slurry and the slurry-coated porous layer is heated at a temperature in the range as described above. Since the carbon is burnt out to form the pores, it is possible to make fine pores evenly distributed. Because the carbon evaporates so as not to remain, the properties of the crystalline glass are not adversely affected.

Thereafter, the thus prepared substrate structure may be metallized through general metallizing treatments. For example, a thick-film wiring method, a simultaneous baking method, or a thin-film wiring method may be used to form conductors on the substrate. In the simultaneous baking method, a pattern of conductive paste is formed on a green sheet and then the green sheet is subjected to simultaneous heating to form both the substrate and the conductor.

As the conductive material, it is preferable to use a material in the group of Au, Cu, and Ag/Pd for thick film formation, a material in the group of Au, Pt, Pd, and Cu for inner layer conductors in the case of simultaneous heating, or Ti, Mo, Ni, or W for thin film formation.

The low-temperature heated substrate according to the present invention may be used for an IC package, a multilayer circuit substrate, and a transistor package, and is suitable as an IC element substrate for a high-speed computer.

An example of the present invention will be described hereunder.

100 portions of $ZnO$—$MgO$—$Al_2O_3$—$SiO_2$, 10 portions of binder (an organic binder), 30 portions of solvent, 1 portion of dispersant, and 50 portions of carbon (the particle size of each component powder being 5 μm or less) were subject to wet-mixing to form a slurry. Green sheets were formed from the slurry, each having a thickness of 0.3 μm were prepared by using a doctor blade method. A second slurry was prepared having the components similar to the foregoing components, but excluding carbon. Next, the green sheets were coated at their opposite surfaces with the second slurry and punched by using a die press so that through holes were formed at predetermined positions of the green sheets. Succeedingly, the through holes of the green sheets were filled with conductive paste (Pt/Cu, Pd/Cu, Pt, Pd, Ni, Au, Cu, Pt/Au, Pd/Au, or the like), and predetermined circuit patterns were printed on the green sheets through screen printing. The green sheets having conductors printed thereon were stacked to form a four-layer structure and then cut into a predetermined size. After a resin-removing treatment, the four-layer structure was put in a belt furnace in which the four-layer structure is held in an atmosphere where the temperature was gradually raised at a rate of 2° C./minute to 650° C. which was maintained for 2 hours so that the four-layer structure was heat treated. The temperature was then further raised at a rate of 2° C./minute to 900° to 1000° C. and this temperature was maintained for an hour until the sintering of the four-layer structure was completed. However, in cases in which a metallizing material such as Cu, Ni, or the like which may be oxidized through sintering in the atmosphere is used, the four-layer structure is held at 650° C. in the atmosphere for two hours for heat treatment and then sintered in a reducing atmosphere or in a non-oxidizing atmosphere.

Figure 2:
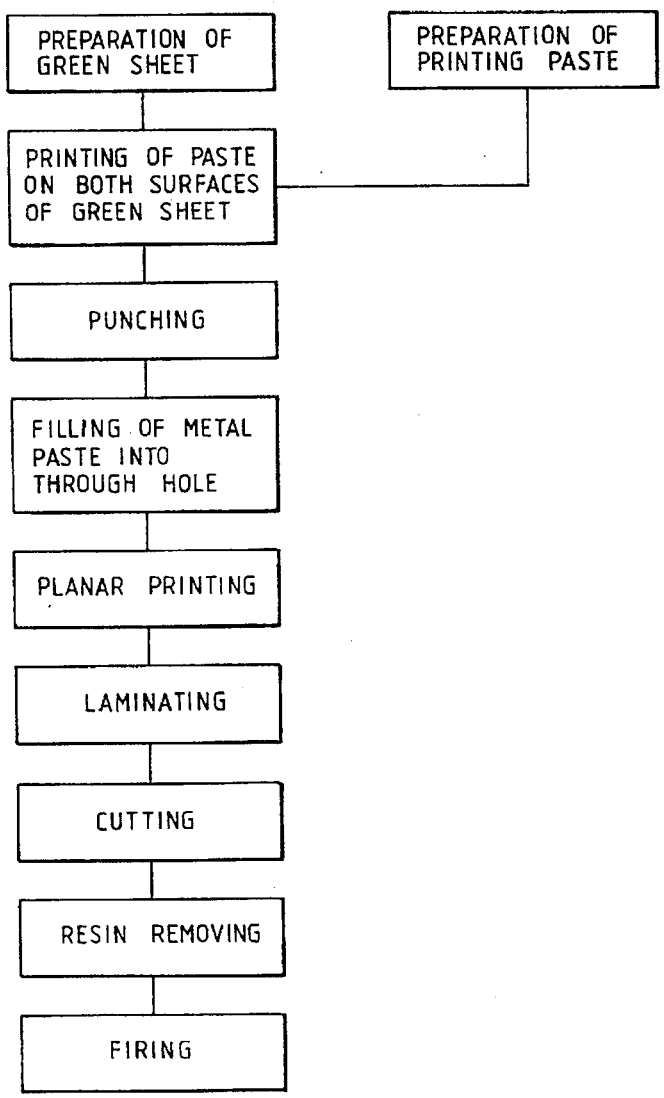
FIG. 2 is a flow chart showing a process of forming substrates in one embodiment of the invention.

Thus, as shown in FIG. 1, a multi-layer circuit substrate was obtained in which an insulating layer 1 has a layered sandwich structure comprised of porous layers 1a and dense layers 1b. In the insulating layer 1, each porous layer 1a was 250 μm thick and each dense layer 1b was 15 μm thick. In FIG. 1, the reference numeral 2 designates a conductor and 3 designates an opening. FIG. 2 is a flow chart showing the foregoing manufacturing process. As a comparative example, a multi-layer circuit substrate was prepared by use of green sheets excluding carbon powder so that an insulting layer consisted of dense layers (280 μm thick).

As a result, a multi-layer circuit substrate of the example according to the present invention had a porosity of 60% and a dielectric constant ($\epsilon_S$) approximately equal to 3 [1 MHz], while that of the comparative example had a porosity of 1% and a dielectric constant ($\epsilon_S$) approximately equal to 6 [1 MHz]. Further, the multi-layer circuit substrate of the example according to the present invention maintained mechanical strength of 11 kg/mm$^2$ which is sufficient for practical use in spite of its high porosity, and further showed a coefficient of thermal expansion $\alpha=3.0\times10^{-6}/°$ C. which approximates that of a silicon element.

As described above, according to the present invention, it is possible to obtain circuit substrates formed at relatively low temperatures which not only have high mechanical strength but also an extremely low dielectric-constant ($\epsilon_S=3$ or less may be attained in a suitable embodiment). This shortens signal delay time making it possible to cope with the recent tendency of making semiconductor devices higher in response speed. In spite of its high porosity, the low-temperature circuit substrate maintains sufficient mechanical strength of 10 to 13 kg/mm$^2$ and shows a coefficient of expansion of 2 to 5×10$^{-6}$/° C. which approximates that of a silicon element. Accordingly, the low-temperature baked circuit substrate is extremely useful in the industrial field.

The invention has been disclosed in terms of preferred embodiments. The invention, however, is not limited thereto. The scope of the invention is determined by the appended claims and their equivalents.

What is claimed is:

1. A multilayered substrate comprising:

a first layer of a crystalline glass having a porosity of less than 5% and a thickness of 10 to 20 μm;

a second layer of a crystalline glass having a closed uniform porosity therein of 30% to about 60% and a thickness of 150 to 250 μm bonded to said first layer, such that said second layer has a dielectric constant of 4.0 or less;

wherein said glass of said first layer and of said second layer has a composition of RO—Al$_2$O$_3$—SiO$_2$ where RO is an oxide selected from the group consisting of CaO, ZnO, MgO, Li$_2$O, ZrO$_2$, B$_2$O$_3$, P$_2$O$_5$, Y$_2$O$_3$, and BaO, and wherein the average pore size of said first layer and said second layer is 10 μm or less.

2. The substrate of claim 1 wherein said substrate includes a third layer bonded to said second layer, said third layer consisting essentially of a crystalline glass having a porosity of less than 5% of the same type as said glass in said first and second layers.

3. The substrate of claim 1 wherein said RO—AL$_2$O$_3$—SiO$_2$ is selected from the group consisting of: ZnO—MgO—Al$_2$O$_3$—SiO$_2$, CaO—B$_2$O$_3$—MgO—Al$_2$O$_3$—SiO$_2$, Y$_2$O$_3$—MgO—Al$_2$O$_3$—SiO$_2$ and 2MgO—5Al$_2$O$_3$—5SiO$_2$.

4. The substrate of claim 3 wherein said crystalline glass has a cordierite structure.

5. The substrate of claim 1 wherein said porosity of said first layer and said porosity of said second layer is uniform and closed.

* * * * *